(12) United States Patent  
Guo

(10) Patent No.: US 12,294,007 B2  
(45) Date of Patent: May 6, 2025

(54) ARRAY SUBSTRATE AND DISPLAY PANEL

(71) Applicant: Wuhan China Star Optoelectronics Technology Co., Ltd., Hubei (CN)

(72) Inventor: Yiyu Guo, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,674

(22) PCT Filed: Dec. 20, 2021

(86) PCT No.: PCT/CN2021/139690  
§ 371 (c)(1),  
(2) Date: Dec. 29, 2021

(87) PCT Pub. No.: WO2023/108678  
PCT Pub. Date: Jun. 22, 2023

(65) Prior Publication Data  
US 2024/0371885 A1  Nov. 7, 2024

(30) Foreign Application Priority Data  
Dec. 15, 2021 (CN) .......................... 202111539804.5

(51) Int. Cl.  
*H01L 27/12* (2006.01)

(52) U.S. Cl.  
CPC ........ *H01L 27/1222* (2013.01); *H01L 27/124* (2013.01)

(58) Field of Classification Search  
CPC ..................... H01L 27/1222; H01L 29/78696  
See application file for complete search history.

(56) References Cited

U.S. PATENT DOCUMENTS

| | | | |
|---|---|---|---|
| 9,647,009 B1* | 5/2017 | Zhao | .............. H01L 27/1222 |
| 2002/0056881 A1 | 5/2002 | Ogawa | |
| 2012/0223313 A1 | 9/2012 | Amano | |
| 2017/0038648 A1* | 2/2017 | Liu | .............. H01L 27/1222 |

FOREIGN PATENT DOCUMENTS

| | | | | |
|---|---|---|---|---|
| CN | 107895726 | | 4/2018 | |
| CN | 108054172 | | 5/2018 | |
| CN | 108054172 A | * | 5/2018 | ......... H01L 27/1222 |
| CN | 108198820 | | 6/2018 | |
| CN | 111463267 | | 7/2020 | |

OTHER PUBLICATIONS

Notification of Office Action and Search Report Dated Jan. 20, 2025 From the State Intellectual Property Office of the People's Republic of China Re. Application No. 202111539804.5 and Its Translation of Office Action into English. (12 Pages).

\* cited by examiner

*Primary Examiner* — Peter M Albrecht

(57) ABSTRACT

An array substrate and a display panel are provided. The array substrate includes transistors. Each transistor includes an active portion and a first gate, and the active portion is disposed on the substrate. The active portion includes at least one semiconductor portion and at least one epitaxial sharp corner portion connected to the semiconductor portion and protruding from the semiconductor portion in a first direction. In the first direction, the epitaxial sharp corner portion is located on one side of the semiconductor portion, the first gate is located on the semiconductor portion and the epitaxial sharp corner portion, and the first gate extends along the first direction.

18 Claims, 7 Drawing Sheets

• An edge region of an active portion in the prior art (0.1V)
○ An edge region of an active portion in the prior art (10V)
□ an epitaxial sharp corner portion of the present application (0.1V)
■ an epitaxial sharp corner portion of the present application (10V)

ARRAY SUBSTRATE AND DISPLAY PANEL

RELATED APPLICATIONS

This application is a National Phase of PCT Patent Application No. PCT/CN2021/139690 having International filing date of Dec. 20, 2021, which claims the benefit of priority of Chinese Patent Application No. 202111539804.5 filed on Dec. 15, 2021. The contents of the above applications are all incorporated by reference as if fully set forth herein in their entirety.

FIELD AND BACKGROUND OF THE INVENTION

This application relates to a field of display technology, particularly relates to an array substrate and a display panel Currently, due to a thin-film transistor (TFT) manufacturing process, after an active layer is etched, a Taper angle, that is, a sharp angle, will be formed on an edge of the active layer, resulting in poor coverage uniformity after a gate insulating layer is deposited. Generally, the gate insulating layer in a taper corner area at the edge of the active layer is thinner than a film layer in the main body area of the active layer, which makes edge thin-film transistor characteristic effect occur earlier, causing a hump effect in a sub-threshold area, and resulting in a decrease in the performance of a device.

An embodiment of the present application provides an array substrate and a display panel to solve the problem of the hump effect caused by different turn-on voltages.

SUMMARY OF THE INVENTION

An embodiment of the present application provides an array substrate, including: a substrate; and a plurality of transistors disposed on the substrate, wherein each transistor includes: an active portion disposed on the substrate, wherein the active portion includes a semiconductor portion and at least one epitaxial sharp corner portion connected to the semiconductor portion and protruding from the semiconductor portion in a first direction, and in the first direction, the epitaxial sharp corner portion is located on a side of the semiconductor portion; an insulating portion disposed on the active portion and covers the active portion; and a first gate disposed on the insulating portion, wherein the first gate is located on the semiconductor portion and the epitaxial sharp corner portion, and the first gate extends along the first direction.

Optionally, in some embodiments of the present application, the array substrate further includes a second gate, wherein the second gate and the first gate are disposed at intervals on the insulating portion, the second gate is located on the semiconductor portion and the epitaxial sharp corner portion, and the second gate extends along the first direction, and wherein the first gate and the second gate are connected in series, independent of each other, or connected in parallel.

Optionally, in some embodiments of the present application, in the first direction, semiconductor portions of adjacent transistors are connected by an epitaxial connection portion, the first gate is located on the semiconductor portion, the epitaxial sharp corner portion, and the epitaxial connection portion; wherein the array substrate further includes a second gate, the second gate and the first gate are disposed at intervals on the insulating portion, and the second gate is located on the semiconductor portion, the epitaxial sharp corner portion, and the epitaxial connection portion; and wherein the semiconductor portion provided with the first gate, the epitaxial sharp corner portion, and the epitaxial connection portion are arranged at intervals with the semiconductor portion provided with the second gate, the epitaxial sharp corner portion, and the epitaxial connection portion.

Optionally, in some embodiments of the present application, in the first direction, semiconductor portions of adjacent transistors are connected by an epitaxial connection portion and the epitaxial sharp corner portion; and wherein the first gate is located on the semiconductor portion, the epitaxial sharp corner portion, and the epitaxial connection portion.

Optionally, in some embodiments of the present application, in the first direction, a length of the epitaxial sharp corner portion is greater than 1 micrometer.

Optionally, in some embodiments of the present application, the first direction intersects a second direction, and wherein in the second direction, a distance from an edge of an orthographic projection of the first gate located on the epitaxial sharp corner portion on the substrate to an edge of an orthographic projection of the epitaxial sharp corner portion on the substrate ranges from 0 to 1 micrometer.

Optionally, in some embodiments of the present application, the active portion is defined with a through-hole on the epitaxial sharp corner portion, and the through-hole penetrates the epitaxial sharp corner portion.

Optionally, in some embodiments of the present application, an aspect ratio of the semiconductor portion ranges from 1:1 to 20:1.

Optionally, in some embodiments of the present application, the array substrate further includes a source and a drain, wherein the active portion includes conductor portions, and the first direction intersects a second direction, and wherein in the second direction, the conductor portions are located on both sides of the semiconductor portion, the source is disposed on one of the conductor portions, and the drain is disposed on another one of the conductor portions.

Optionally, in some embodiments of the present application, the active portion is defined with a through-hole on the epitaxial connection portion, and the through-hole penetrates the epitaxial connection portion.

Optionally, in some embodiments of the present application, in the first direction, a width of the first gate located on the semiconductor portion is same as a width of the first gate located on the epitaxial sharp corner portion.

Correspondingly, the present application further provides a display panel, including an array substrate, and the array substrate includes: a substrate; and a plurality of transistors disposed on the substrate, wherein each transistor includes: an active portion disposed on the substrate, wherein the active portion includes a semiconductor portion and at least one epitaxial sharp corner portion connected to the semiconductor portion and protruding from the semiconductor portion in a first direction, and in the first direction, the epitaxial sharp corner portion is located on a side of the semiconductor portion; an insulating portion disposed on the active portion and covers the active portion; and a first gate disposed on the insulating portion, wherein the first gate is located on the semiconductor portion and the epitaxial sharp corner portion, and the first gate extends along the first direction.

Optionally, in some embodiments of the present application, the array substrate further includes a second gate, the second gate and the first gate are disposed at intervals on the insulating portion, and the second gate is located on the semiconductor portion and the epitaxial sharp corner portion, the second gate extends along the first direction, and wherein the first gate and the second gate are connected in series, independent of each other, or connected in parallel.

Optionally, in some embodiments of the present application, in the first direction, semiconductor portions of adjacent transistors are connected by an epitaxial connection portion, the first gate is located on the semiconductor portion, the epitaxial sharp corner portion, and the epitaxial connection portion; wherein the array substrate further includes a second gate, the second gate and the first gate are disposed at intervals on the insulating portion, and the second gate is located on the semiconductor portion, the epitaxial sharp corner portion, and the epitaxial connection portion; and wherein the semiconductor portion provided with the first gate, the epitaxial sharp corner portion, and the epitaxial connection portion are arranged at intervals with the semiconductor portion provided with the second gate, the epitaxial sharp corner portion, and the epitaxial connection portion.

Optionally, in some embodiments of the present application, in the first direction, semiconductor portions of adjacent transistors are connected by an epitaxial connection portion and the epitaxial sharp corner portion; and wherein the first gate is located on the semiconductor portion, the epitaxial sharp corner portion, and the epitaxial connection portion.

Optionally, in some embodiments of the present application, in the first direction, a length of the epitaxial sharp corner portion is greater than 1 micrometer.

Optionally, in some embodiments of the present application, the first direction intersects a second direction, and wherein in the second direction, a distance from an edge of an orthographic projection of the first gate located on the epitaxial sharp corner portion on the substrate to an edge of an orthographic projection of the epitaxial sharp corner portion on the substrate ranges from 0 to 1 micrometer.

Optionally, in some embodiments of the present application, the active portion is defined with a through-hole on the epitaxial sharp corner portion, and the through-hole penetrates the epitaxial sharp corner portion.

Optionally, in some embodiments of the present application, an aspect ratio of the semiconductor portion ranges from 1:1 to 20:1.

Optionally, in some embodiments of the present application, the array substrate further includes a source and a drain, and wherein the active portion includes conductor portions, and the first direction intersects a second direction, and wherein in the second direction, the conductor portions are located on both sides of the semiconductor portion, the source is disposed on one of the conductor portions, and the drain is disposed on another one of the conductor portions.

This application discloses an array substrate and a display panel. The array substrate includes a substrate and a plurality of transistors, and each transistor is disposed on the substrate. Wherein, each transistor includes an active portion, an insulating portion, and a first gate. The active portion is disposed on the substrate, and the active portion includes a semiconductor portion and at least one epitaxial sharp corner portion connected to the semiconductor portion and protruding from the semiconductor portion in a first direction. In the first direction, the epitaxial sharp corner portion is located on a side of the semiconductor portion, the insulating portion is disposed on the active portion and covers the active portion, and the first gate is disposed on the insulating portion, the first gate is located on the semiconductor portion and the epitaxial sharp corner portion, and the first gate extends along the first direction. In the present application, in the first direction, by extending the epitaxial sharp corner portion of the active portion outwards, the current of the epitaxial sharp corner portion that does not participate in the operation of the semiconductor portion is reduced or suppressed. This prevents the hump effect caused by the difference in the turn-on voltage, thereby improving the performance of the array substrate.

BRIEF DESCRIPTION OF THE SEVERAL VIEWS OF THE DRAWINGS

In order to describe the technical solutions in the embodiments of the present application more clearly, the following will briefly introduce the drawings that need to be used in the description of the embodiments. Obviously, the drawings in the description are only some embodiments of the present application. For those skilled in the art, other drawings can be obtained based on these drawings without doing creative work.

DETAILED-DESCRIPTION OF SPECIFIC EMBODIMENTS OF THE INVENTION

Figure 1:
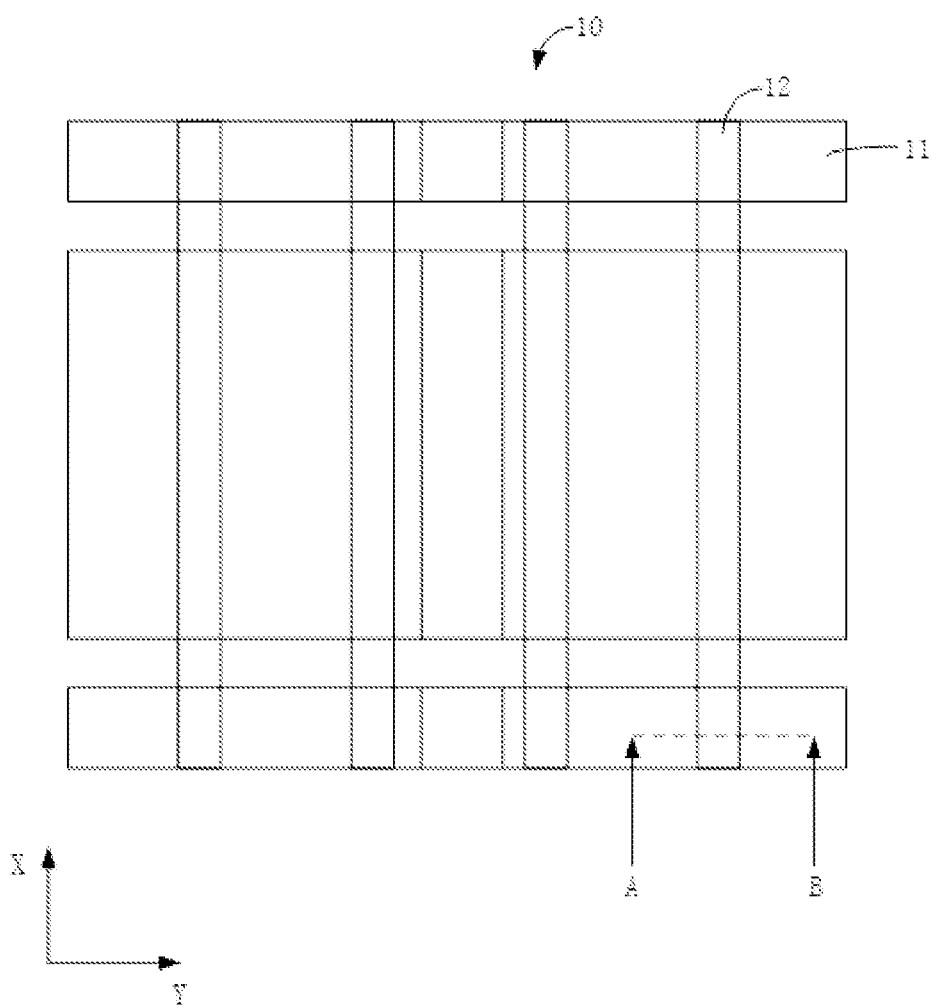
FIG. 1 is a schematic plan view of an array substrate provided by the prior art.

The following will describe the technical solutions in the embodiments of the present application clearly and completely with reference to the drawings in the embodiments of the present application. Obviously, the embodiments are only a part of the embodiments of the present application, rather than all the embodiments. Based on these embodiments in this application, all other embodiments obtained by those skilled in the art without doing creative work shall fall within the protection scope of this application. In addition, the specific implementations described herein are only used to illustrate and explain the present application and are not used to limit the present application. In this application, unless otherwise stated, the directional terms used such as "above" or "under" generally refer to above the device or under the device in actual use or working state. Specifically, it is the direction in the drawings, and "inner" and "outer"

refer to the outline of the device. In the present application, "reaction" can be a chemical reaction or a physical reaction.

Please refer to FIG. 1 to FIG. 4. It can be seen from FIG. 1 and FIG. 2 that in the prior art, the transistors in the array substrate 10 are not connected between the active portions 11 of adjacent transistors in the first direction X. That is, the active portions 11 of adjacent transistors in the same row are not connected, and the transistors in the same row share the same gate 12.

Figure 2:
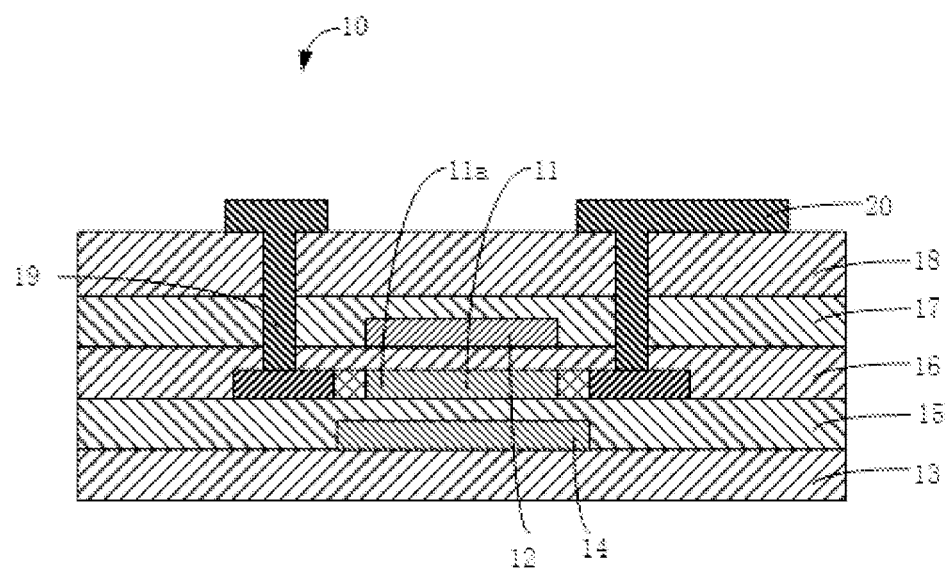
FIG. 2 is a schematic structural view of a transistor of the array substrate taken along a line AB provided in FIG. 1.

Please refer to FIG. 2, each transistor further includes a substrate 13, a light-shielding portion 14, a buffer portion 15, a gate insulating portion 16, a planarization portion 17, a passivation portion 18, a source 19, and a drain 20. The light-shielding portion 14 is disposed on substrate 13, the buffer portion 15 is disposed on substrate 13 and light-shielding portion 14, active portion 11 is disposed on buffer portion 15, the gate insulating portion 16 is disposed on buffer portion 15 and active portion 11, gate 12 is disposed on gate insulating portion, the planarization portion 17 is disposed on gate 12 and gate insulating portion, and passivation portion 18 is disposed on planarization portion 17, source 19 and drain 20 are disposed on passivation portion 18 in the same layer, source 19 is connected to one conductor of active portion 11, and drain 20 is connected to another conductor of active portion 11.

Figure 3:
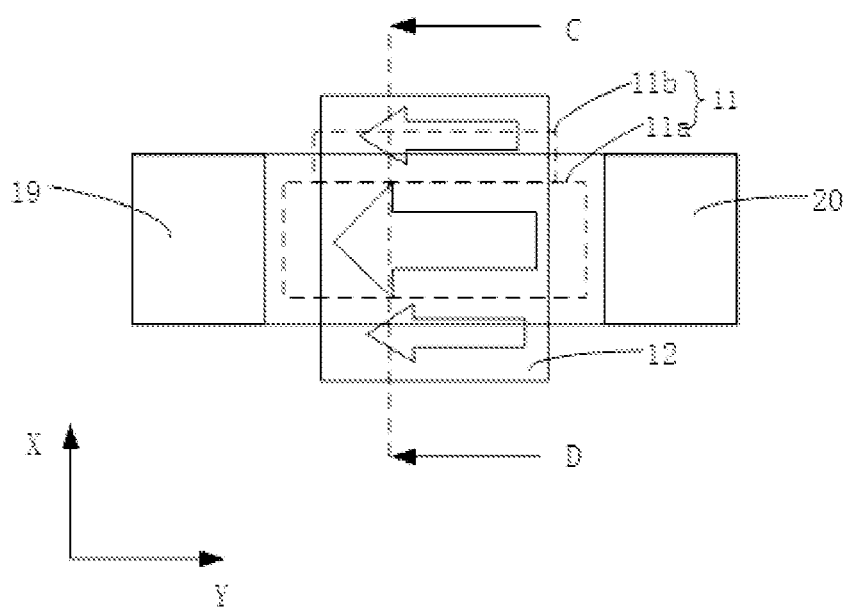
FIG. 3 is an enlarged schematic plan view of the transistor in the array substrate provided in FIG. 1.
Figure 4:
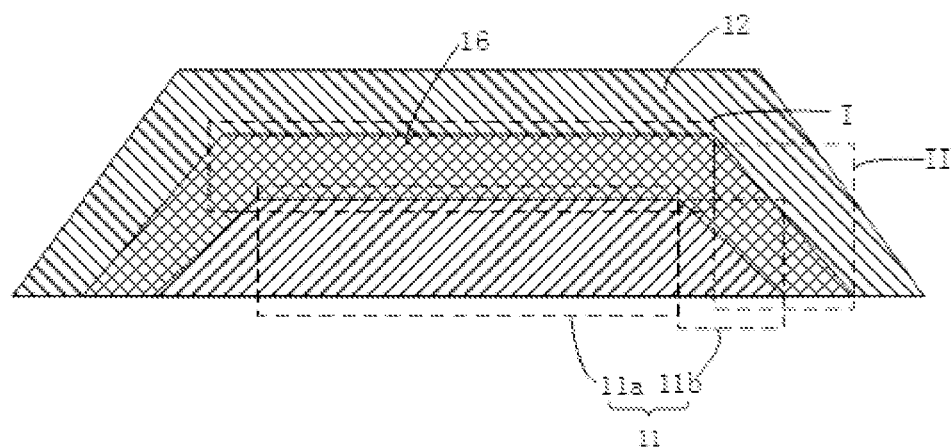
FIG. 4 is a schematic structural diagram of the transistor in FIG. 3 taken along a CD line.

Please refer to FIG. 3. The current of the array substrate 10 is composed of a main leakage current $I_a$ and an edge leakage current $I_c$. The voltage of gate 12 controls the movement of carriers in the channel region 11a of the active portion 11, and determines the turn-on, working, and turn-off states of the array substrate 10. Please refer to FIG. 4. The edge region 11b of the active portion 11 will form a taper angle, that is, a sharp angle after being etched. As a result, the coverage uniformity of the gate insulating portion 16 is not good, that is, the film thickness of the gate insulating portion 16 in zone II is smaller than that in zone I. Under the same gate bias voltage Vg, the electric field intensities of the two regions are different. The electric field intensity in zone II is greater than that in zone I. As a result, the edge region 11b of the active portion 11 will be turned on before the channel region 11a of the active portion 11 is turned on. Therefore, the hump effect occurs, that is, the hump effect is caused by the different turn-on voltages.

Therefore, in the prior art array substrate 10, after the active portion 11 is etched, a taper angle will be formed, resulting in poor coverage of the insulating portion of the gate 12. As a result, the edge region 11b of the active portion 11 will be turned on before the channel region 11a of the active portion 11 is turned on, which causes the hump effect. That is, the edge of the active portion 11 is turned on in advance, which causes the hump effect.

In order to solve the aforesaid problems, the present application provides an array substrate and a display panel, which can prevent the edge of the active portion in the prior art from being turned on in advance, which may cause the problem of the hump effect.

This application discloses an array substrate and a display panel. The array substrate includes a substrate and a plurality of transistors, and each transistor is disposed on the substrate. Wherein each transistor includes an active portion, an insulating portion, and a first gate. The active portion is disposed on the substrate, and the active portion includes a semiconductor portion and at least one epitaxial sharp corner portion connected to the semiconductor portion and protruding from the semiconductor portion in a first direction. In the first direction, the epitaxial sharp corner portion is located on a side of the semiconductor portion. The insulating portion is disposed on the active portion and covers the active portion. The first gate is disposed on the insulating portion, and the first gate is located on the semiconductor portion and the epitaxial sharp corner portion, and the first gate extends along the first direction.

In the present application, in the first direction, by moving the epitaxial sharp corner portion of the active portion outwards, so that the current of the epitaxial sharp corner portion that does not participate in the work of the semiconductor portion is reduced or suppressed. This prevents the hump effect caused by the difference in the turn-on voltage, thereby improving the performance of the array substrate.

Figure 5:
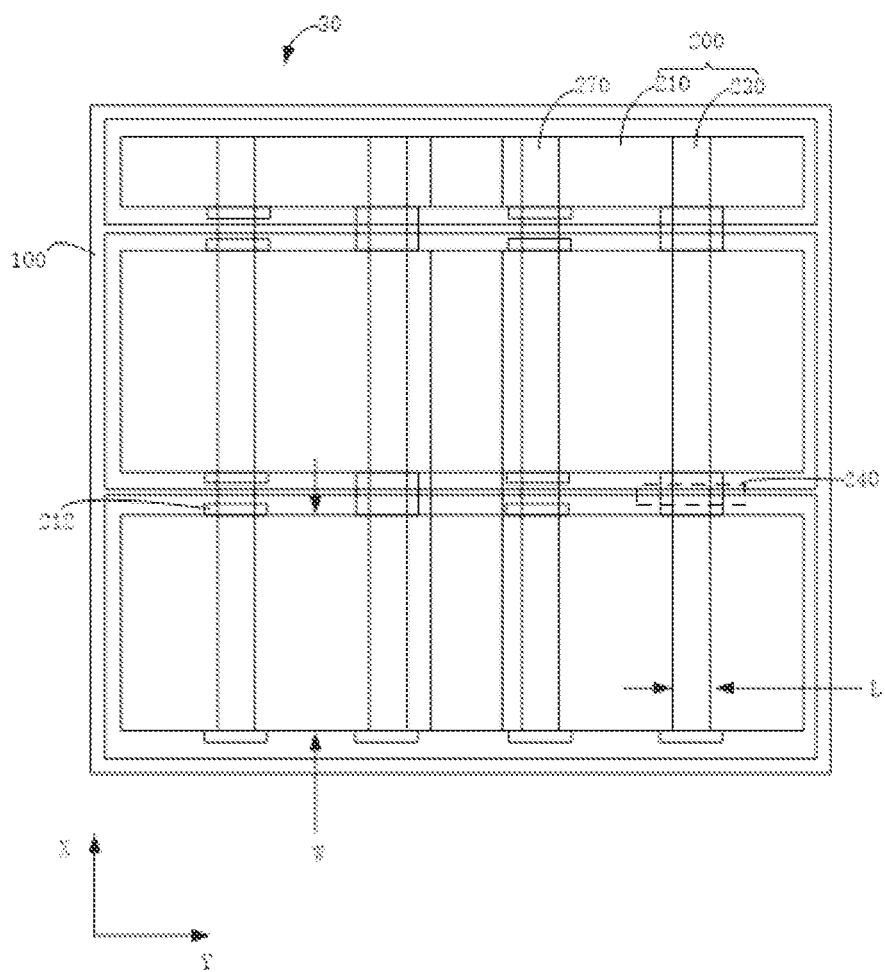
FIG. 5 is a schematic plan view of a first type array substrate provided by an embodiment of the present application.
Figure 6:
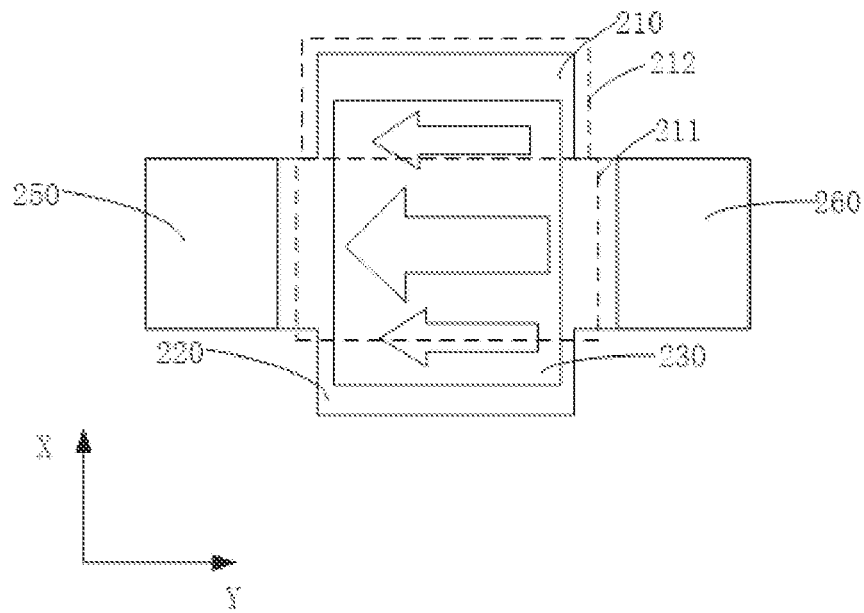
FIG. 6 is an enlarged schematic plan view of a transistor of the array substrate in FIG. 5 provided by an embodiment of the present application.

FIG. 5 is a first schematic plan view of an array substrate provided by an embodiment of the present application. FIG. 6 is an enlarged schematic plan view of a transistor of the array substrate in FIG. 5 provided by an embodiment of the present application. The present application provides an array substrate 30, which includes a substrate 100 and a plurality of transistors 200. The specific description is as follows.

Each transistor 200 is disposed on the substrate 100, wherein each transistor 200 includes an active portion 210, an insulating portion 220, and a first gate 230. The active portion 210 is disposed on the substrate 100. The active portion 210 includes a semiconductor portion 211 and an epitaxial sharp corner portion 212 connected to the semiconductor portion 211 and protruding from the semiconductor portion 211 in the first direction X. In the first direction X, the epitaxial sharp corner portion 212 is located on a side of the semiconductor portion 211.

In the present application, in the first direction X, an epitaxial sharp corner portion 212 connected to the semiconductor portion 211 and protruding from the semiconductor portion 211 is provided so that the current of the epitaxial sharp corner portion 212 that does not participate in the work of the active portion 210 is reduced or suppressed, and because the epitaxial sharp corner portion 212 protrudes from the semiconductor portion 211, the film thickness of the insulating portion 220 that is subsequently covered on the semiconductor portion 211 is uniform, so that the turn-on voltage is consistent. That is, the epitaxial sharp corner portion 212 is prevented from turning on before the semiconductor portion 211 is turned on, thereby preventing the hump effect, and improving the performance of the array substrate 30.

Figure 7:
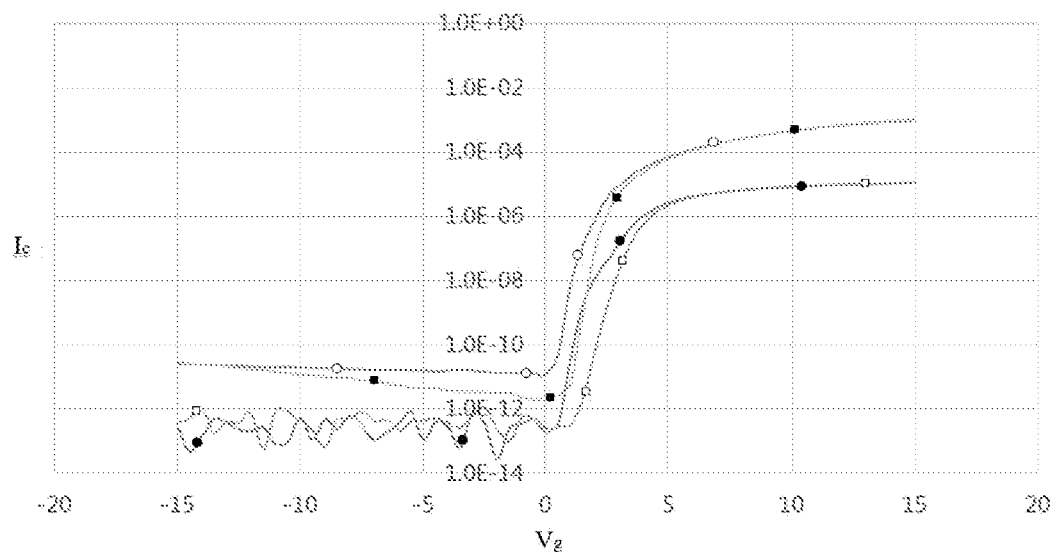
FIG. 7 is a schematic diagram of a gate bias voltage versus current provided by the present application. This figure shows a relationship between the gate bias and current of an epitaxial sharp corner portion of a transistor provided by the present application and a relationship between the gate bias and current of an edge region of an active portion in the prior art.

Please refer to FIG. 7. FIG. 7 is a schematic diagram of a gate bias voltage versus current provided by the present application. This figure shows a relationship between the gate bias and current of an epitaxial sharp corner portion of a transistor provided by the present application and a relationship between the gate bias and current of an edge region of an active portion in the prior art. A voltage of 0.1 V is applied to the epitaxial sharp corner portion 212 provided in the present application and the edge region 11b of the active portion 11 in the prior art. When Vg is 0.1 to 3 V, the current of the epitaxial sharp corner portion 212 provided in the present application is less than that of the edge region 11b of the active portion 11 in the prior art. A voltage of 10 V is applied to the epitaxial sharp corner portion 212 provided in the present application and the edge region 11b of the active portion 11 in the prior art. When Vg ranges from 0.1 to 3 V, the current of the epitaxial sharp corner portion 212 provided in the present application is less than that of the edge region 11b of the active portion 11 in the prior art. It can be seen from this that the transistor provided by the present application reduces or suppresses the current of the epitaxial sharp corner portion that does not participate in the operation of the active portion. This can prevent the edge region 11b of the active portion 11 from turning on before the channel region 11a of the active portion 11 in the prior art, which may cause the hump effect. That is, the present application can prevent the hump effect caused by different turn-on voltages.

In one embodiment, in the first direction X, the length of the epitaxial sharp corner portion 212 is greater than 1 micrometer. Specifically, in the first direction X, the length of the epitaxial sharp corner portion 212 may be greater than 1 micrometer, 3 micrometers, 5 micrometers, 10 micrometers, 50 micrometers, 80 micrometers, 1000 micrometers, or the like. In this application, in the first direction X, the length of the epitaxial sharp corner portion 212 is configured to be greater than 1 micrometer, so that the edge leakage current Ic can be ignored. This can prevent the epitaxial sharp corner portion 212 from being turned on before the semiconductor portion 211 is turned on, which prevents the problem of the hump effect, thereby improving the performance of the array substrate 30.

In one embodiment, in the first direction X, the epitaxial sharp corner portions 212 of the plurality of transistors 200 may all be located on the same side or different sides, that is, the epitaxial sharp corner portions 212 may all be located on the same side of the semiconductor portion 211. For example, the epitaxial sharp corner portions 212 of two adjacent transistors 200 are both located below the semiconductor portion 211, that is, the epitaxial sharp corner portion 212 of the active portion 210 of one transistor 200 is located on a side away from another epitaxial sharp corner portion 212 of the active portion 210 of the other transistor 200. Alternatively, the epitaxial sharp corner portion 212 of the active portion 210 of one transistor 200 is located close to the epitaxial sharp corner portion 212 of the active portion 210 of another transistor 200.

In one embodiment, the active portion 210 is defined with a through-hole 201, the through-hole 201 is located on the epitaxial sharp corner portion 212, and the through-hole 201 penetrates the epitaxial sharp corner portion 212 to expose the substrate 100. In the present application, the through-holes 201 are defined on the epitaxial sharp corner portions 212 to improve the heat dissipation efficiency of the array substrate 30, which reduces the temperature of the array substrate 30, thereby ensuring the performance of the array substrate 30.

In one embodiment, the planar shape of the through-hole 201 may be one or a combination of a rectangle, an ellipse, a quadrilateral, a triangle, or an irregular pattern. But it is not limited to this.

In one embodiment, in the first direction X, both sides of the semiconductor portion 211 are provided with epitaxial sharp corner portions 212. In the present application, in the first direction X, the epitaxial sharp corner portions 212 are provided on both sides of the semiconductor portion 211, which further makes the film thickness of the subsequently covered insulating portion 220 on the semiconductor portion 211 uniform, so that the turn-on voltage is consistent. That is, the epitaxial sharp corner portion 212 is prevented from turning on before the semiconductor portion 211 is turned on, which prevents the hump effect from occurring, thereby improving the performance of the array substrate 30.

In one embodiment, the active portion 210 includes two connected semiconductor portions 211.

In one embodiment, the active portion 210 further includes a conductor portion 213. In the second direction Y, the first direction X intersects the second direction Y, and the conductor portion 213 is located on both sides of the semiconductor portion 211.

In one embodiment, the width-to-length ratio (W/L) of the semiconductor portion 211 ranges from 1:1 to 20:1. Specifically, the range of the width-to-length ratio (W/L) of the semiconductor portion 211 may be 2:1, 6:1, 8:1, 10:1, 12:1, 18:1, or 20:1. In this embodiment, the width-to-length ratio (W/L) of the semiconductor portion 211 is configured to range from 1:1 to 20:1 to improve the negative voltage bias of the array substrate 30, thereby improving the performance of the array substrate 30.

In one embodiment, the array substrate 30 further includes an epitaxial connection portion 240. In the first direction X, the epitaxial sharp corner portion 212 of the transistor 200 and the semiconductor portion 211 of the adjacent transistor 200 are connected by the epitaxial connection portion 240.

The insulating portion 220 is disposed on the active portion 210 and covers the active portion 210.

The first gate 230 is disposed on the insulating portion 220, and the first gate 230 is located on the semiconductor portion 211, the epitaxial sharp corner portion 212, and the epitaxial connection portion 240. The first gate 230 extends in the first direction X.

In one embodiment, in the second direction Y, the distance from the edge of the orthographic projection of the first gate 230 located on the epitaxial sharp corner portion 212 on the substrate 100 to the edge of the orthographic projection of the epitaxial sharp corner portion 212 on the substrate 100 ranges from 0 to 1 micrometer. Specifically, in the second direction Y, the distance from the edge of the orthographic projection of the first gate 230 located on the epitaxial sharp corner portion 212 on the substrate 100 to the edge of the orthographic projection of the epitaxial sharp corner portion 212 on the substrate 100 may be 0 micrometers, 0.3 micrometers, 0.5 micrometers, 0.8 micrometers, or 1 micron, etc. When in the second direction Y, the distance from the edge of the orthographic projection of the first gate 230 located on the epitaxial sharp corner portion 212 on the substrate 100 to the edge of the orthographic projection of the epitaxial sharp corner portion 212 on the substrate 100 is 0 micrometers, the orthographic projection of the first gate 230 located on the epitaxial sharp corner portion 212 on the substrate 100 completely coincides with the orthographic projection of the epitaxial sharp corner portion 212 on the substrate 100.

In the present application, in the second direction Y, the distance from the edge of the orthographic projection of the first gate 230 located on the epitaxial sharp corner portion 212 on the substrate 100 to the edge of the orthographic projection of the epitaxial sharp corner portion 212 on the substrate 100 ranges from 0 to 1 micrometer, which further prevents the hump effect from occurring, thereby further improving the performance of the array substrate 30.

In one embodiment, in the first direction X, the width of the first gate 230 located on the semiconductor portion 211 is the same as the width of the first gate 230 located on the epitaxial sharp corner portion 212. In the present application, in the first direction X, the width of the first gate 230 located on the semiconductor portion 211 is configured to be the same as the width of the first gate 230 located on the epitaxial sharp corner portion 212, thereby simplifying the manufacturing of the array substrate 30.

In one embodiment, the transistor 200 further includes a source 250 and a drain 260. The source 250 is disposed on a conductor portion 213. The drain 260 is disposed on the other conductor portion 213.

It should be noted that the transistor 200 of the present application can be a multiplexed transistor, which can be used in the design of a display panel integrated circuit.

In one embodiment, the array substrate 30 further includes a second gate 270, wherein the second gate 270 and the first gate 230 are spaced apart on the insulating portion 220, and the second gate 270 is located on the semiconductor portion 211 and the epitaxial sharp corner portion 212. The second gate 270 extends along the first direction X. The first gate 230 and the second gate 270 are connected in series, independent of each other, or connected in parallel. The semiconductor portion 211 provided with the first gate 230, the epitaxial sharp corner portion 212, and the epitaxial connection portion 240 are arranged at intervals with another semiconductor portion 211 provided with the second gate 270, the epitaxial sharp corner portion 212, and the epitaxial connection portion 240.

In the present application, the transistor 200 is a double-gate transistor 200, which can increase the mobility of the device, thereby improving the performance of the array substrate 30.

Figure 8:
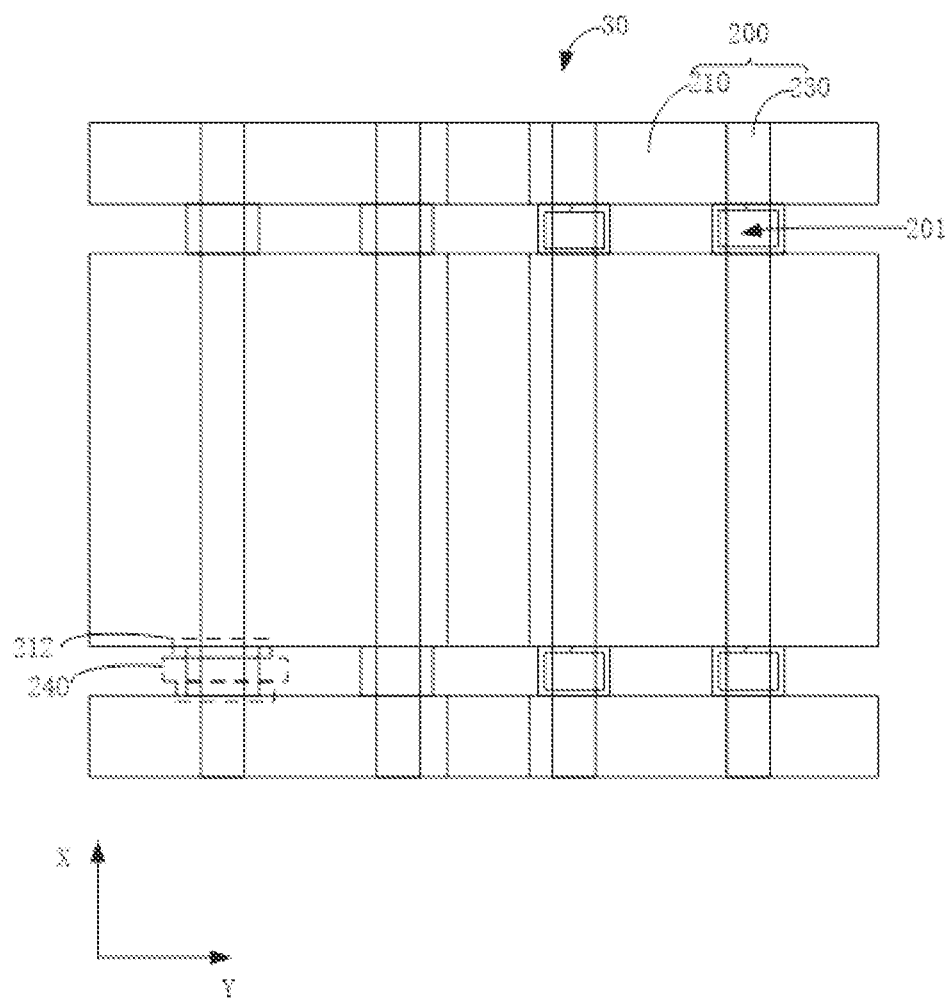
FIG. 8 is a schematic plan view of a second type array substrate provided by an embodiment of the present application.

Please refer to FIG. 8. FIG. 8 is a schematic plan view of a second type array substrate provided by an embodiment of the present application. It should be noted that the difference between the second type plan view and the first type plan view is that the through-hole 201 is located on the epitaxial connection portion 240, and a part of the epitaxial connection portion 240 is defined with the through-hole 201.

Figure 9:
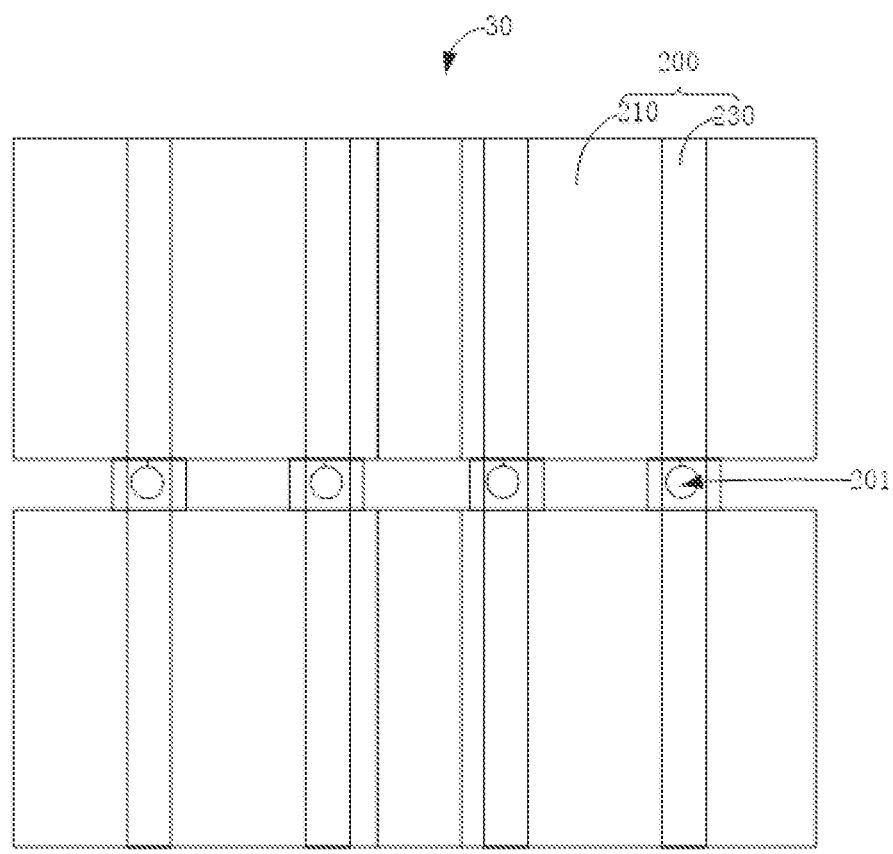
FIG. 9 is a schematic plan view of a third type array substrate provided by an embodiment of the present application.

Please refer to FIG. 9. FIG. 9 is a schematic plan view of a third type array substrate provided by an embodiment of the present application. It should be noted that the difference between the third type plan view and the second type plan view is that the through-holes 201 are all located at the epitaxial connection portion 240. In the present application, the through-holes 201 are all defined on the epitaxial connection portion 240, which improves the heat dissipation efficiency of the film layer, thereby further improving the performance of the array substrate 30.

The present application further provides a display panel. The display panel includes the array substrate 30 described in the present application.

The present application provides an array substrate 30 and a display panel. The array substrate 30 includes a substrate 100 and a plurality of transistors 200, and each transistor 200 is disposed on substrate 100, wherein, each transistor 200 includes an active portion 210, an insulating portion 220, and a first gate 230. The active portion 210 is disposed on the substrate 100. The active portion 210 includes a semiconductor portion 211 and at least one epitaxial sharp corner portion 212 connected to the semiconductor portion 211 and protruding from the semiconductor portion 211 in the first direction X. In the first direction X, the epitaxial sharp corner portion 212 is located on one side of the semiconductor portion 211, and the insulating portion 220 is disposed on the active portion 210 and covers the active portion 210. The first gate 230 is disposed on the insulating portion 220, and the first gate 230 is located on the semiconductor portion 211 and the epitaxial sharp corner portion 212, and the first gate 230 extends along the first direction X. In the present application, in the first direction X, by expanding the epitaxial sharp corner portion 212 of the active portion 210 outwards, the current of the epitaxial sharp corner portions 212 that do not participate in the operation of the semiconductor portion 211 is reduced or suppressed. This prevents the hump effect caused by the difference in the turn-on voltage, thereby improving the performance of the array substrate 30.

The array substrate and the display panel provided by the embodiments of the present application are described in detail above. Specific examples are used to illustrate the principles and implementation of the application, and the descriptions of the examples are only used to help understand the methods and core ideas of the present application. In addition, for those skilled in the art, according to the idea of this application, there will be changes in the specific implementation and the scope of the present application. As described above, the content of this specification should not be construed as a limitation to this application.

What is claimed is:

1. An array substrate, comprising:
a substrate; and
a plurality of transistors disposed on the substrate, wherein each transistor comprises:
an active portion disposed on the substrate, wherein the active portion comprises a semiconductor portion and at least one epitaxial sharp corner portion connected to the semiconductor portion and protruding from the semiconductor portion in a first direction, and in the first direction, the epitaxial sharp corner portion is located on a side of the semiconductor portion;
an insulating portion disposed on the active portion and covering the active portion; and
a first gate disposed on the insulating portion, wherein the first gate is located on the semiconductor portion and the epitaxial sharp corner portion, and the first gate extends along the first direction;
the array substrate further comprising a second gate, wherein the second gate and the first gate are disposed at intervals on the insulating portion, the second gate is located on the semiconductor portion and the epitaxial sharp corner portion, and the second gate extends along the first direction, and wherein the first gate and the second gate are connected in series, independent of each other, or connected in parallel.

2. The array substrate of claim 1, wherein in the first direction, semiconductor portions of adjacent transistors are connected by an epitaxial connection portion, the first gate is located on the semiconductor portion, the epitaxial sharp corner portion, and the epitaxial connection portion;
wherein the second gate and the first gate are disposed at intervals on the insulating portion, and the second gate is located on the semiconductor portion, the epitaxial sharp corner portion, and the epitaxial connection portion; and
wherein one of the semiconductor portions provided with the first gate, an epitaxial sharp corner portion, and an epitaxial connection portion are arranged at intervals with another one of the semiconductor portions provided with the second gate, an epitaxial sharp corner portion, and an epitaxial connection portion.

3. The array substrate of claim 1, wherein in the first direction, semiconductor portions of adjacent transistors are connected by an epitaxial connection portion and the epitaxial sharp corner portion; and wherein the first gate is located on the semiconductor portion, the epitaxial sharp corner portion, and the epitaxial connection portion.

4. The array substrate of claim 1, wherein in the first direction, a length of the epitaxial sharp corner portion is greater than 1 micrometer.

5. The array substrate of claim 1, wherein the first direction intersects a second direction, and wherein in the second direction, a distance from an edge of an orthographic projection of the first gate located on the epitaxial sharp corner portion on the substrate to an edge of an orthographic projection of the epitaxial sharp corner portion on the substrate ranges from 0 to 1 micrometer.

6. The array substrate of claim 1, wherein the active portion is defined with a through-hole on the epitaxial sharp corner portion, and the through-hole penetrates the epitaxial sharp corner portion.

7. The array substrate of claim 1, wherein an aspect ratio of the semiconductor portion ranges from 1:1 to 20:1.

8. The array substrate of claim 1, further comprising a source and a drain, wherein the active portion comprises two conductor portions, and the first direction intersects a second direction, and wherein in the second direction, the two conductor portions are located on both sides of the semiconductor portion, the source is disposed on one of the two conductor portions, and the drain is disposed on another one of the two conductor portions.

9. The array substrate of claim 1, wherein in the first direction, a width of the first gate located on the semiconductor portion is same as a width of the first gate located on the epitaxial sharp corner portion.

10. A display panel, comprising an array substrate, wherein the array substrate comprises:
   a substrate; and
   a plurality of transistors disposed on the substrate, wherein each transistor comprises:
   an active portion disposed on the substrate, wherein the active portion comprises a semiconductor portion and at least one epitaxial sharp corner portion connected to the semiconductor portion and protruding from the semiconductor portion in a first direction, and in the first direction, the epitaxial sharp corner portion is located on a side of the semiconductor portion;
   an insulating portion disposed on the active portion and covering the active portion; and
   a first gate disposed on the insulating portion, wherein the first gate is located on the semiconductor portion and the epitaxial sharp corner portion, and the first gate extends along the first direction;
   wherein the array substrate further comprises a second gate, the second gate and the first gate are disposed at intervals on the insulating portion, and the second gate is located on the semiconductor portion and the epitaxial sharp corner portion, the second gate extends along the first direction, and wherein the first gate and the second gate are connected in series, independent of each other, or connected in parallel.

11. The display panel of claim 10, wherein in the first direction, semiconductor portions of adjacent transistors are connected by an epitaxial connection portion, the first gate is located on the semiconductor portion, the epitaxial sharp corner portion, and the epitaxial connection portion; wherein the second gate and the first gate are disposed at intervals on the insulating portion, and the second gate is located on the semiconductor portion, the epitaxial sharp corner portion, and the epitaxial connection portion; and
   wherein one of the semiconductor portions provided with the first gate, an epitaxial sharp corner portion, and an epitaxial connection portion are arranged at intervals with another one of the semiconductor portions provided with the second gate, an epitaxial sharp corner portion, and an epitaxial connection portion.

12. The display panel of claim 10, wherein in the first direction, semiconductor portions of adjacent transistors are connected by an epitaxial connection portion and the epitaxial sharp corner portion; and wherein the first gate is located on the semiconductor portion, the epitaxial sharp corner portion, and the epitaxial connection portion.

13. The display panel of claim 10, wherein in the first direction, a length of the epitaxial sharp corner portion is greater than 1 micrometer.

14. The display panel of claim 10, wherein the first direction intersects a second direction, and wherein in the second direction, a distance from an edge of an orthographic projection of the first gate located on the epitaxial sharp corner portion on the substrate to an edge of an orthographic projection of the epitaxial sharp corner portion on the substrate ranges from 0 to 1 micrometer.

15. The display panel of claim 11, wherein the active portion is defined with a through-hole on the epitaxial sharp corner portion, and the through-hole penetrates the epitaxial sharp corner portion.

16. The array substrate display panel of claim 10, wherein an aspect ratio of the semiconductor portion ranges from 1:1 to 20:1.

17. The display panel of claim 10, wherein the array substrate further comprises a source and a drain, and wherein the active portion comprises two conductor portions, and the first direction intersects a second direction, and wherein in the second direction, the two conductor portions are located on both sides of the semiconductor portion, the source is disposed on one of the two conductor portions, and the drain is disposed on another one of the two conductor portions.

18. An array substrate, comprising:
   a substrate; and
   a plurality of transistors disposed on the substrate, wherein each transistor comprises:
   an active portion disposed on the substrate, wherein the active portion comprises a semiconductor portion and at least one epitaxial sharp corner portion connected to the semiconductor portion and protruding from the semiconductor portion in a first direction, and in the first direction, the epitaxial sharp corner portion is located on a side of the semiconductor portion;
   an insulating portion disposed on the active portion and covering the active portion; and
   a first gate disposed on the insulating portion, wherein the first gate is located on the semiconductor portion and the epitaxial sharp corner portion, and the first gate extends along the first direction;
   wherein in the first direction, semiconductor portions of adjacent transistors are connected by an epitaxial connection portion and the epitaxial sharp corner portion; and
   wherein the first gate is located on the semiconductor portion, the epitaxial sharp corner portion, and the epitaxial connection portion;
   wherein the active portion is defined with a through-hole on the epitaxial connection portion, and the through-hole penetrates the epitaxial connection portion.

* * * * *